(12) United States Patent
Coolbaugh et al.

(10) Patent No.: US 6,440,811 B1
(45) Date of Patent: Aug. 27, 2002

(54) METHOD OF FABRICATING A POLY-POLY CAPACITOR WITH A SIGE BICMOS INTEGRATION SCHEME

(75) Inventors: Douglas Duane Coolbaugh, Essex Junction; James Stuart Dunn, Jericho; Stephen Arthur St. Onge, Colchester, all of VT (US)

(73) Assignee: International Business Machines Corporation, Armonk, CA (US)

( * ) Notice: Subject to any disclaimer, the term of this patent is extended or adjusted under 35 U.S.C. 154(b) by 0 days.

(21) Appl. No.: 09/745,361

(22) Filed: Dec. 21, 2000

(51) Int. Cl.⁷ .......................................... H01L 21/8228
(52) U.S. Cl. ....................... 438/324; 438/239
(58) Field of Search ................. 438/239, 202, 438/778, 322, 324

(56) References Cited

U.S. PATENT DOCUMENTS

| | | | |
|---|---|---|---|
| 5,130,885 A | * | 7/1992 | Fazan et al. ................. 361/313 |
| 5,173,437 A | | 12/1992 | Chi |
| 5,195,017 A | | 3/1993 | McDonald |
| 5,286,991 A | | 2/1994 | Hui et al. |
| 5,633,181 A | | 5/1997 | Hayashi |
| 5,691,220 A | | 11/1997 | Ohnishi et al. |
| 5,939,753 A | | 8/1999 | Ma et al. |
| 6,074,907 A | | 6/2000 | Oh et al. |
| 6,156,594 A | * | 12/2000 | Gris ........................... 438/202 |
| 6,218,315 B1 | * | 4/2001 | Ballamine et al. .......... 438/778 |

FOREIGN PATENT DOCUMENTS

WO   WO 92/14262   8/1992

* cited by examiner

Primary Examiner—John F. Niebling
Assistant Examiner—Christopher Lattin
(74) Attorney, Agent, or Firm—Scully, Scott, Murphy & Presser; William D. Sabo (57) ABSTRACT

A method for fabricating a poly-poly capacitor integrated with a BiCMOS process which includes forming a lower plate electrode of a poly-poly capacitor during deposition of a gate electrode of a CMOS transistor; and forming an upper SiGe plate electrode during growth of a SiGe base region of a heterojunction bipolar transistor.

18 Claims, 8 Drawing Sheets

METHOD OF FABRICATING A POLY-POLY CAPACITOR WITH A SIGE BICMOS INTEGRATION SCHEME

FIELD OF THE INVENTION

The present invention relates to BiCMOS (i.e., bipolar and complementary metal oxide semiconductor (CMOS)) technology, and more particularly to a method of fabricating a polysilicon to polysilicon, i.e., poly-poly, capacitor integrated with a SiGe heterojunction bipolar transistor.

BACKGROUND OF THE INVENTION

In the field of semiconductor device manufacturing, CMOS and BiCMOS technologies have been widely used for integrating highly complex analog-digital subsystems onto a single chip. In such subsystems, high precision capacitors are typically required.

Several types of capacitors are presently available including diffusion-poly capacitors, poly-poly capacitors and metal-metal capacitors. In order to meet the demand for high precision capacitors in today's generation of integrated devices, poly-poly capacitors have been increasingly used.

Despite its high precision, a poly-poly capacitor is a compromise between high cost and ideal capacitor characteristics since it is relatively easy to construct, and has electrical characteristics that are better than diffusion-poly capacitors, but inferior electrical characteristics to metal-metal capacitors. However, a metal-metal capacitor is much more difficult to fabricate than are poly-poly capacitors.

Moreover, poly-poly capacitors are known to have a more linear V-C relationship than MOS (i.e., diffusion-poly) capacitors. The dielectric for MOS capacitors results from an oxide that is thermally grown over a highly doped diffusion region. In contrast, the dielectric for a poly-poly capacitor is generally a deposited chemical vapor deposition (CVD) oxide and reliability requirements cause the resulting oxide to be thicker than can be realized with a thermal oxide. Therefore, higher capacitance values generally result for MOS capacitors than poly-poly capacitors.

Although various methods of forming poly-poly capacitors are known, most prior art methods are not suitable for integration with BiCMOS processing schemes. In view of the BiCMOS integration problem with prior art methods, there is a continued need for developing a new and improved method of fabricating a poly-poly capacitor utilizing existing polysilicon layers and masking steps employed in conventional BiCMOS processes. Specifically, it would be highly beneficial if a method of fabricating a poly-poly capacitor could be developed in which the bottom plate of the capacitor was formed from a gate of the MOS transistor, and wherein the top plate of the capacitor was formed from the base region of a heterojunction bipolar transistor.

SUMMARY OF THE INVENTION

One object of the present invention is to provide a method of fabricating a poly-poly capacitor for use in CMOS or BiCMOS integrated circuits that is not complicated or expensive.

Another object of the present invention is to provide a method of manufacturing a poly-poly capacitor utilizing existing polysilicon and masking steps, thereby achieving the integration of the poly-poly capacitor into a BiCMOS device at a low cost.

A yet further object of the present invention is to provide a method of fabricating a poly-poly capacitor utilizing steps and structures that are typically used to form the gate of the MOS transistor and SiGe base structure of the bipolar transistor in a BiCMOS process.

These and other objects and advantages are achieved by utilizing the inventive method in which the lower polysilicon layer of the capacitor is formed during deposition of the CMOS gate electrode and the upper SiGe polysilicon layer of the capacitor is formed during the growth of the base region of the SiGe heterojunction bipolar transistor. Broadly speaking, the inventive method thus comprises forming a lower plate electrode of a poly-poly capacitor during deposition of a gate electrode of a CMOS transistor; and forming an upper SiGe plate electrode during growth of a SiGe base region of a heterojunction bipolar transistor.

Specifically, and in a first embodiment of the present invention, the inventive method comprises the steps of:

(a) forming a first polysilicon layer over a portion of an isolation region in a device region in which a poly-poly capacitor is to be formed;

(b) forming first nitride spacers about said first polysilicon layer;

(c) depositing a nitride layer over said first polysilicon layer and said first nitride spacers;

(d) implanting ions of a first conductivity type into said first polysilicon layer so as to form a lower electrode of said poly-poly capacitor;

(e) removing portions of said nitride layer so as to form second nitride spacers and to expose a portion of said lower electrode;

(f) forming a film stack on at least said exposed portion of said lower electrode, said film stack comprising an oxide layer, a second layer of polysilicon and a layer of SiGe;

(g) implanting ions of a second conductivity type that are different from said first conductivity type into said layer of SiGe and said second layer of polysilicon;

(h) etching at least said layer of SiGe and said second layer of polysilicon so as to form an upper electrode of said poly-poly capacitor; and (i) saliciding all exposed surfaces of said upper electrode.

It is noted that the above processing steps are used in forming a high capacitance poly-poly capacitor. Alternatively, a patterned protective nitride layer can be formed on portions of the exposed upper electrode prior to saliciding the structure.

In accordance with the second embodiment of the present invention, in which a high voltage device is formed, the method of the present invention comprises the steps of:

(a) forming a first polysilicon layer over a portion of an isolation region in a device region in which a poly-poly capacitor is to be formed;

(b) forming first nitride spacers about said first polysilicon layer;

(c) depositing a nitride layer over said first polysilicon layer and said first nitride spacers;

(d) implanting ions of a first conductivity type into said first polysilicon layer so as to form a lower electrode of said poly-poly capacitor;

(e) forming a film stack on at least said nitride layer, said film stack comprising an oxide layer, a second layer of polysilicon and a layer of SiGe;

(f) implanting ions of a second conductivity type that are different from said first conductivity type into said layer of SiGe and said second layer of polysilicon;

(g) etching at least said layer of SiGe and said second layer of polysilicon so as to form an upper electrode of said poly-poly capacitor; and (h) saliciding all exposed surfaces of said upper electrode.

As is the case in the first embodiment, a patterned protective nitride layer can be formed on at least a portion of the exposed upper electrode prior to salicidation.

It is emphasized herein that the doped first layer of polysilicon serves as the lower electrode of the inventive poly-poly capacitor, whereas the doped SiGe layer together with the doped second layer of polysilicon serve as an upper electrode of the poly-poly capacitor.

DETAILED DESCRIPTION OF THE INVENTION

The present invention, which provides a method of fabricating a poly-poly capacitor integrated with a SiGe BICMOS process, will now be described in more detail by referring to the drawings that accompany the present application. It should be noted that like and corresponding elements are referred to by like and corresponding reference numerals. Furthermore, in the drawings of the present invention, only the capacitor device region of the BiCMOS device is shown. The CMOS and bipolar device regions, which are not shown in the drawings, are formed in regions that are adjacent to the capacitor device region shown in the drawings.

Figure 1:
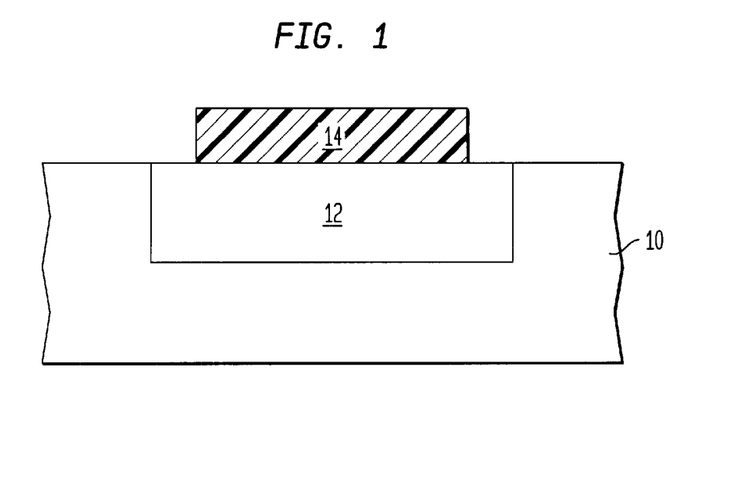
FIGS. 1–9 are cross-sectional views of a poly-poly capacitor through various processing steps used in the first embodiment of the present invention.

Reference is first made to FIGS. 1–9 which illustrate the formation of a high capacitance poly-poly capacitor through various processing steps used in a first embodiment of the present invention. Specifically, FIG. 1 shows the formation of a first polysilicon layer 14 over a portion of isolation region 12, which is formed in semiconductor substrate 10. Semiconductor substrate 10 is composed of a conventional semiconducting material including, but not limited to: Si, Ge, SiGe, GaAs, InAs, InP and all other III/V compound semiconductors. Layered substrates such as Si/Si or Si/SiGe are also contemplated herein. Of these semiconducting materials, it is preferred that the semiconductor substrate be composed of Si. The semiconductor substrate may be a p-type substrate or a n-type substrate depending on the type of MOS device to be present in the final BiCMOS structure.

The isolation region may be a LOCOS (local oxidation of silicon) region or a trench isolation region, with preference given to a trench isolation region such as shown in FIG. 1. When LOCOS isolation is employed, conventional oxidation processes well known to those skilled in the art are used in forming region 12. On the other hand, when isolation region 12 is a trench isolation region, such as shown in FIG. 1, the isolation trench region is formed utilizing conventional lithography, etching and trench filling. Since the formation of isolation regions includes conventional processes well known to those ed in the art, a detailed description concerning the same is not provided herein.

First polysilicon layer 14 which will subsequently become the lower electrode of the poly-poly capacitor is also formed in the CMOS device region and will be used in the CMOS device region as the gate electrode of the CMOS device. First polysilicon layer 14 is formed in the present invention utilizing a conventional deposition process including, but not limited to: chemical vapor deposition (CVD), plasma-assisted CVD, sputtering, chemical solution deposition and other like deposition processes. The thickness of the first polysilicon layer may vary, but typically the first polysilicon layer has a thickness of from about 500 to about 5000 Å, with a thickness of from about 1000 to about 2000 Å being more highly preferred.

Figure 2:
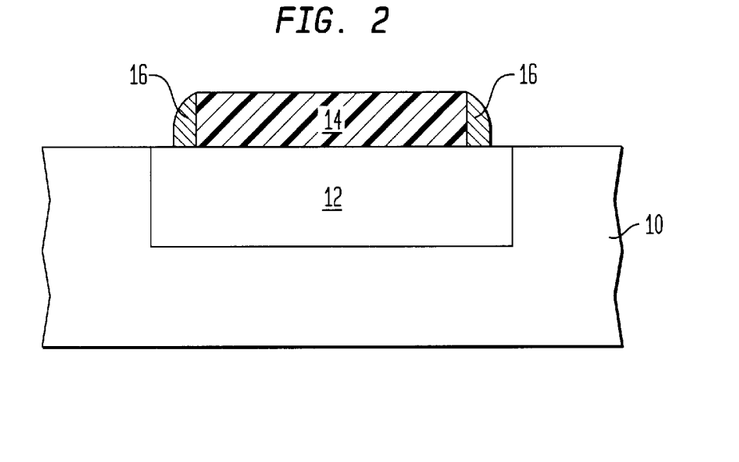

Next, and as illustrated in FIG. 2, first nitride spacers 16 are formed about the first polysilicon layer. Specifically, first nitride spacers 16 are formed on exposed vertical edges of the previously formed first polysilicon layer. The first nitride spacers which are composed of a conventional nitride material such as $Si_3N_4$ are formed by a conventional deposition process such as CVD, plasma-assisted CVD and other like deposition processes, followed by lithography and etching. The etching process employed in forming first nitride spacers 16 is a conventional etching process which has a high selectivity for removing nitride as compared to polysilicon.

Figure 3:
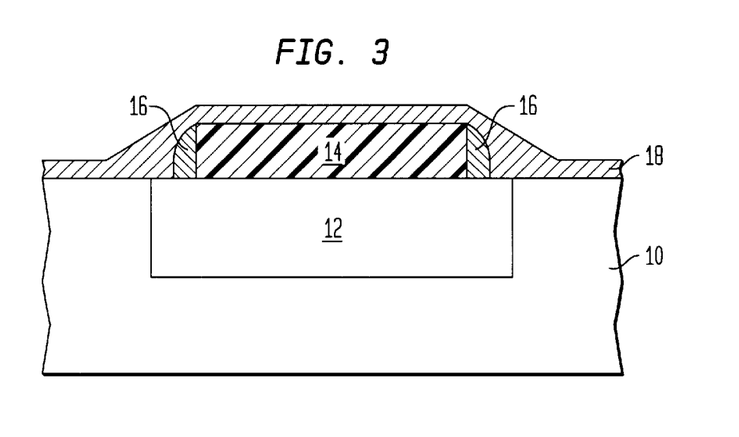

FIG. 3 shows the poly-poly capacitor structure after forming second nitride layer 18 over the structure shown in FIG. 2. Specifically, the second nitride layer is formed over first polysilicon layer 14 and first nitride spacers 16 utilizing a conventional deposition process which is the same or different as used in forming the first nitride spacers. Moreover, the second nitride layer may be composed of the same or different nitride-containing material as the first nitride spacers. It is noted that the second nitride layer serves to protect the adjacent device regions during the formation of the poly-poly capacitor.

Figure 4:
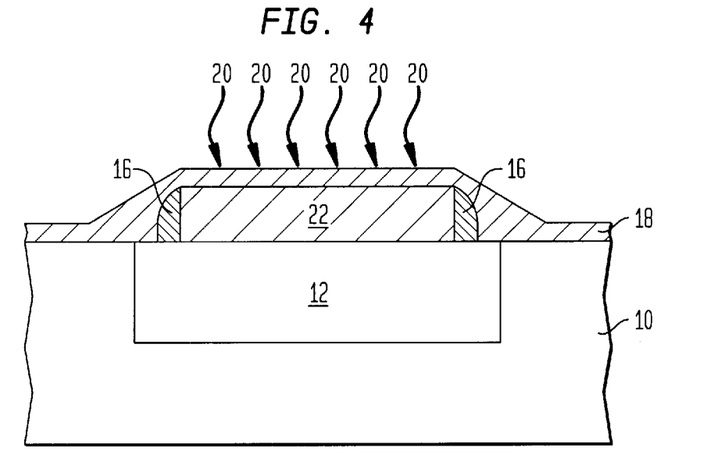

With the second nitride layer in place, ions of a first conductivity type (P- or N-type) 20 are implanted into the first polysilicon layer so as to form lower electrode 22 of the poly-poly capacitor, See FIG. 4. The ion implantation used in forming the lower electrode of the poly-poly capacitor is carried out in a conventional ion implantation apparatus which is capable of operating at conventional implant energies. The concentration of the dopant ion used in this implant step may vary and is within values typically used by those skilled in the art. Moreover, the type of dopant ion employed in this step of the present invention is only dependent upon the type of device to be fabricated.

Figure 5:
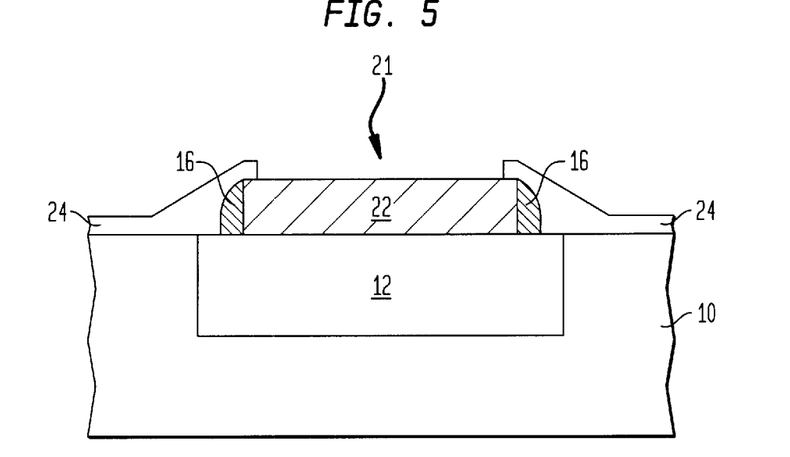

In accordance with the first embodiment of the present invention which is used in making high capacitance poly-poly capacitors, the second nitride layer is patterned utilizing conventional lithography and thereafter an etching process which has a high selectivity for removing nitride as compared to doped polysilicon is employed so as to form second nitride spacers 24, See FIG. 5. Specifically, second nitride layer 18 is etched so as to form a window 21 in the second nitride layer that exposes a portion of the underlying lower electrode.

Figure 6:
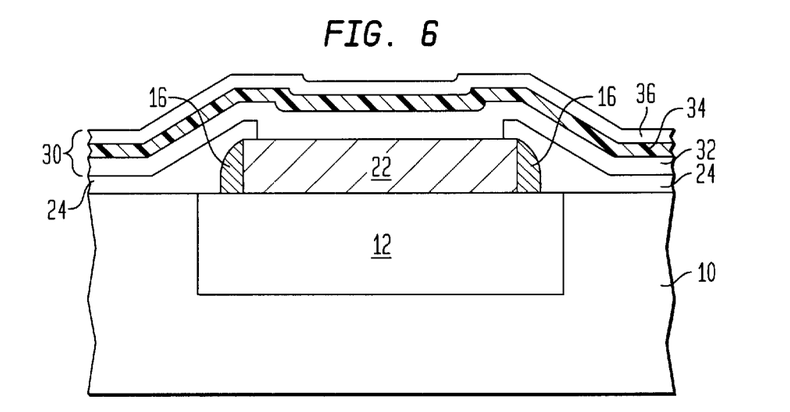

Next, and as is illustrated in FIG. 6, film stack 30 is formed on the structure shown in FIG. 5. In accordance with the present invention, film stack 30 is composed of a layer of oxide 32, a second layer of polysilicon 34 and a layer of SiGe 36. The layer of oxide 32 is formed in the present invention utilizing a conventional deposition process such as CVD or alternatively, oxide layer 32 can be formed by a conventional thermal growing process. The thickness of the oxide layer may vary, but typically, oxide layer 32 of film stack 30 has a thickness of from about 50 to about 200 Å.

Polysilicon layer 34 of film stack 30 is formed utilizing the same or different deposition process as used in forming first polysilicon layer 14. The thickness of polysilicon layer 34 may vary, but typically second polysilicon layer 34 of film stack 30 has a thickness of from about 100 to about 1000 Å SiGe layer 36 of film stack 30, which also is used in forming the SiGe base region of the bipolar transistor region (not shown), is formed utilizing a conventional deposition process including, but not limited to: ultra-high vacuum chemical vapor deposition (UHVCVD), molecular beam epitaxy (MBE), rapid thermal chemical vapor deposition (RTCVD), and plasma-enhanced chemical vapor deposition (PECVD). It is noted that the SiGe thickness may vary, and thus is not limited to a specific thickness range. Each of the aforementioned deposition processes used in forming the SiGe layer include the use of conventional conditions that are well known to those skilled in the art. The conditions may vary depending on the type of deposition process used in forming the SiGe layer.

Figure 7:
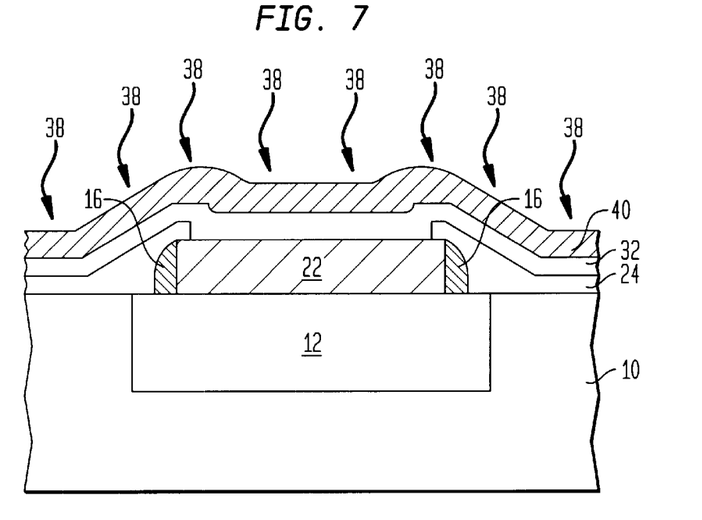

After film stack 30 has been formed over the exposed lower electrode, SiGe layer 36 and second polysilicon layer 34 are subjected to an ion implantation process wherein ions of a second conductivity type 38 that are different from the first are implanted into layers 36 and 34. Specifically, the above mentioned second ion implantation step is carried out in a conventional ion implantation apparatus which is capable of operating at conventional implant energies. The concentration of the dopant ion used in this implant step, i.e., doping of layers 36 and 34, may vary and is dependent on the type of dopant implanted into the first polysilicon layer. This step of the present invention which forms doped layer 40 is shown in FIG. 7. It is noted that doped layer 40 is a combination of SiGe layer 36 and second polysilicon 34. Moreover, doped layer 40 serves as the upper electrode of the inventive poly-poly capacitor.

Figure 8:
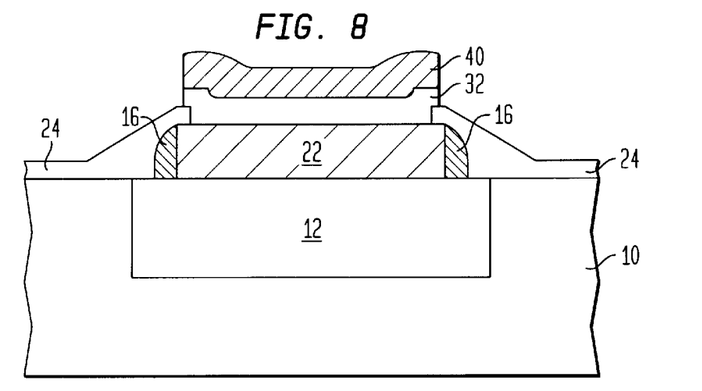

After doping the SiGe and second polysilicon layers with ions of a second conductivity type, doped layer 40 (i.e., doped SiGe and doped second polysilicon layers) is subjected to conventional lithography and etching processes which are capable of patterning the doped SiGe+second polysilicon layer into upper electrode 40 forming the structure shown in FIG. 8. It should be noted that during etching of the doped SiGe+second polysilicon layer, some of the underlying oxide layer may be also be etched.

Figure 9:
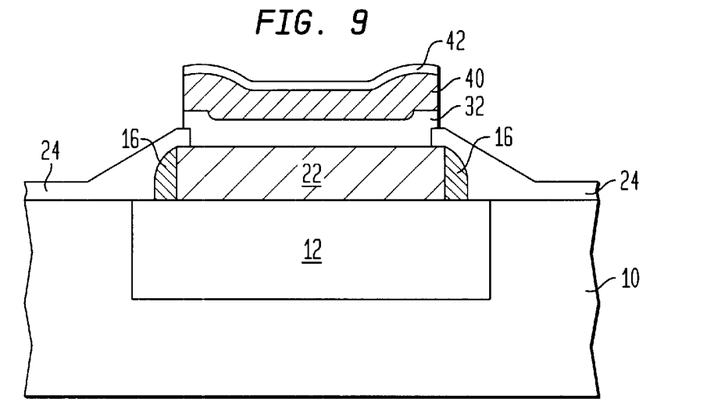

Following this step of the present invention, the upper electrode i.e., doped layer 40, may be optionally subjected to another ion implantation process wherein additional second ions are implanted into the upper electrode. It is noted that this optional additional implant step forms source and drain regions (not shown in the drawings) in the CMOS device region. FIG. 9 shows the structure after the exposed surfaces of the upper electrode have been subjected to a conventional salidication process wherein salicide region 42 is formed therein. The salidication process is carried utilizing conventional annealing temperatures and times well known to those skilled in the art.

Figure 10:
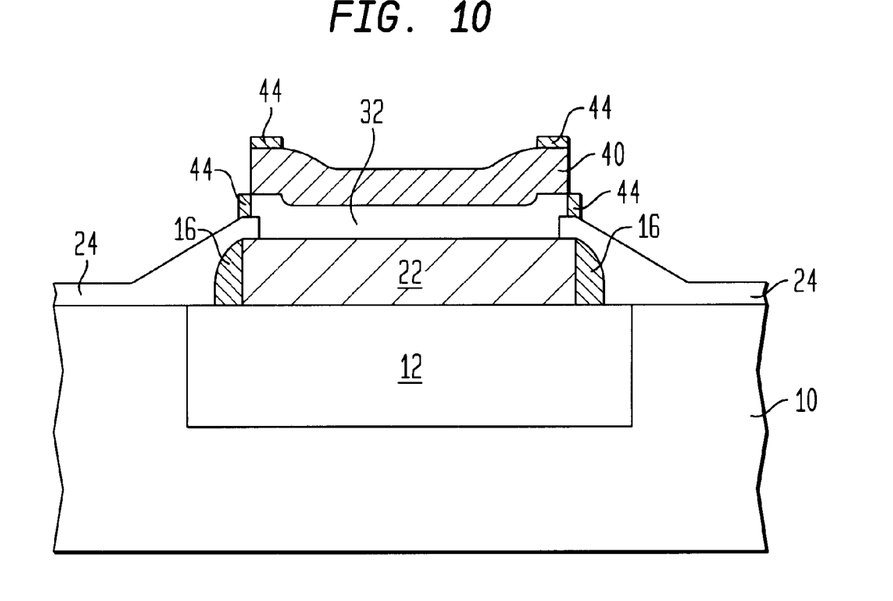
FIGS. 10–11 show an optional processing step wherein a patterned protective nitride layer is employed in the first embodiment of the present invention.
Figure 11:
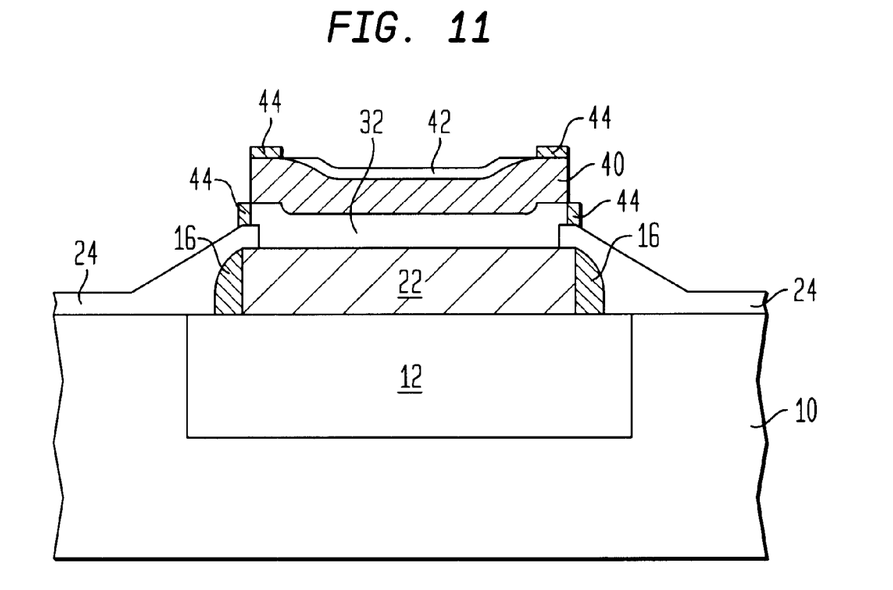
Figure 12:
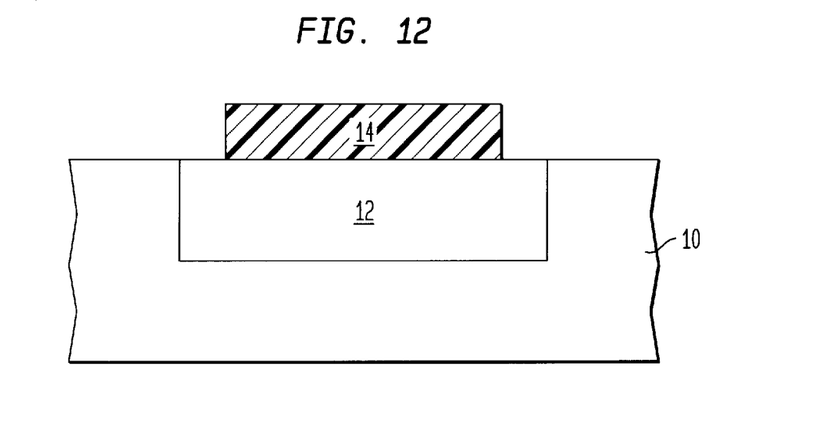
FIGS. 12–19 are cross-sectional views of a poly-poly capacitor through various processing steps used in the second embodiment of the present invention.
Figure 13:
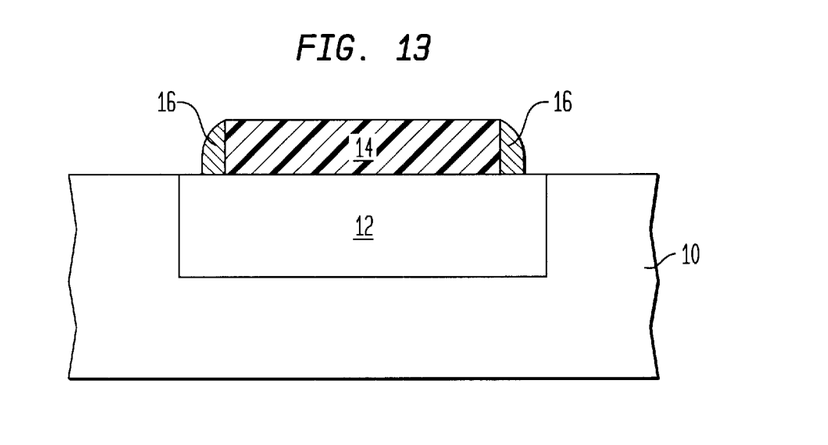
Figure 14:
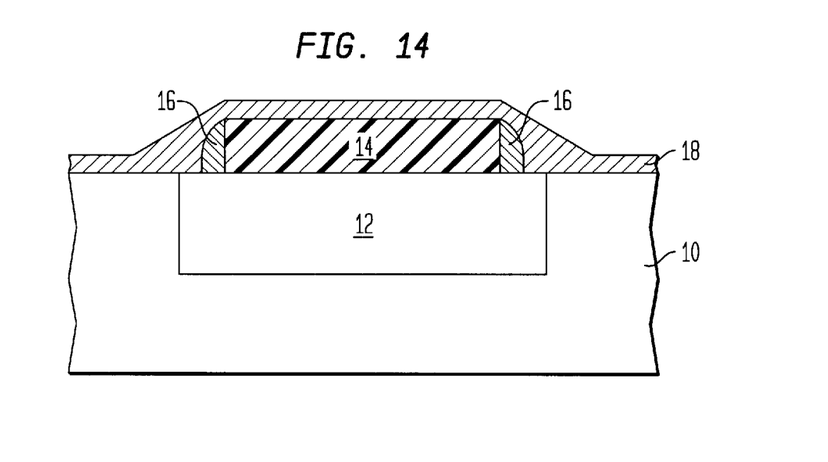
Figure 15:
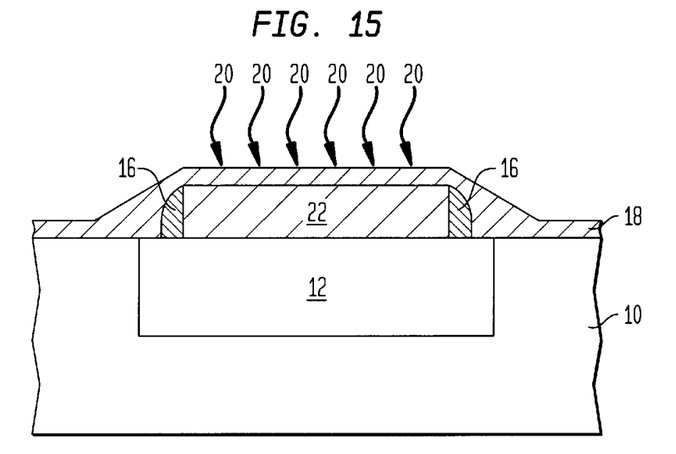
Figure 16:
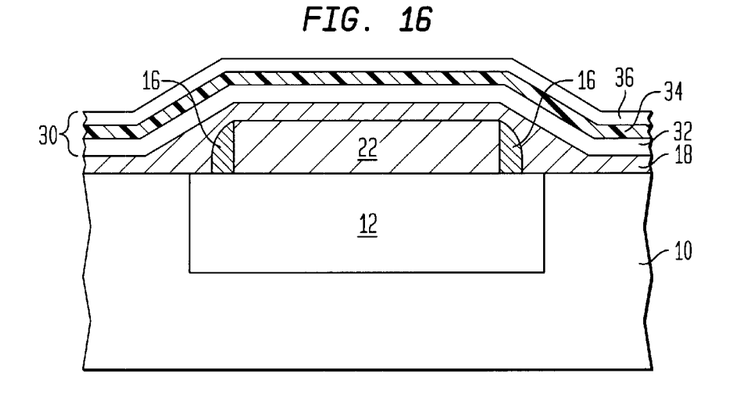

FIGS. 10–11 show additional processing steps that may be employed in the first method of the present invention prior to conducting the salicidation process. Specifically, FIG. 10 shows the structure of FIG. 9 which includes patterned protective nitride layer 44 formed on horizontal surfaces of the poly-poly capacitor. The patterned protective layer is formed by a conventional deposition process, followed by lithography and etching. FIG. 11 shows the structure after conducting the above-mentioned salicidation process.

Figure 17:
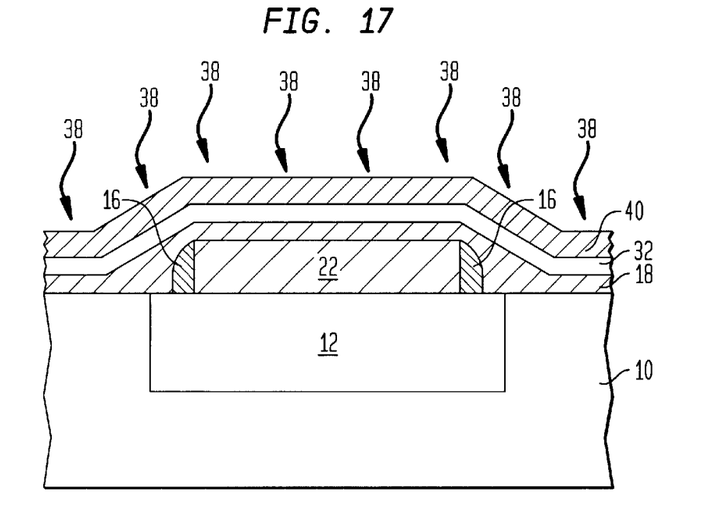
Figure 18:
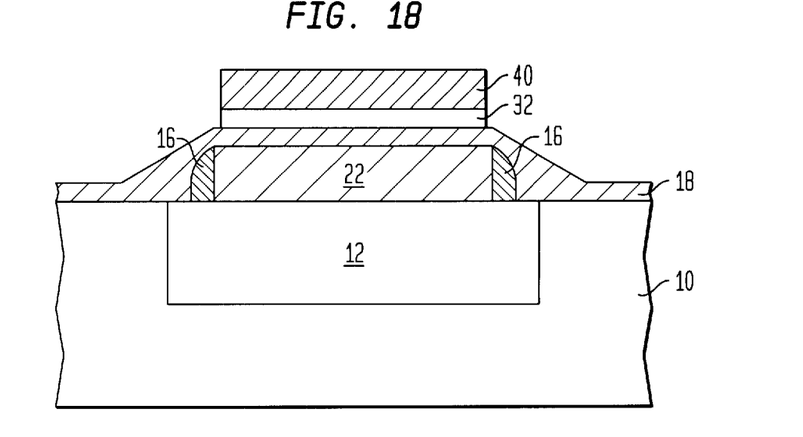
Figure 19:
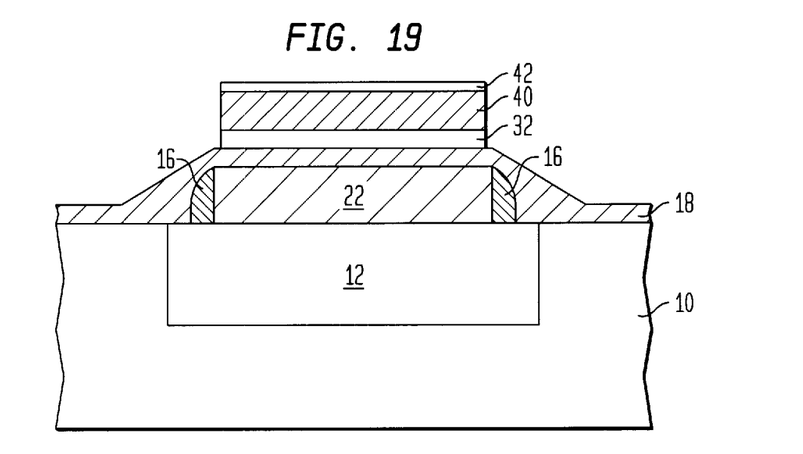

FIGS. 12–19 show the second embodiment of the present invention in which second nitride layer 18 remains in the structure throughout the various processing steps. This results in a high voltage poly-poly capacitor device. Specifically, the processing steps used in forming the structures shown in FIGS. 12–15 are identical to that shown in FIGS. 1–4 above. Instead of etching the nitride layer as shown in FIG. 5, the nitride layer in this embodiment of the present invention is not etched and film stack 30 is formed thereon utilizing the processing steps mentioned above so as to provide the structure shown in FIG. 16. FIGS. 17–19 are identical to FIGS. 7–9 with the exception that the poly-poly capacitor includes second nitride layer 18 therein.

Figure 20:
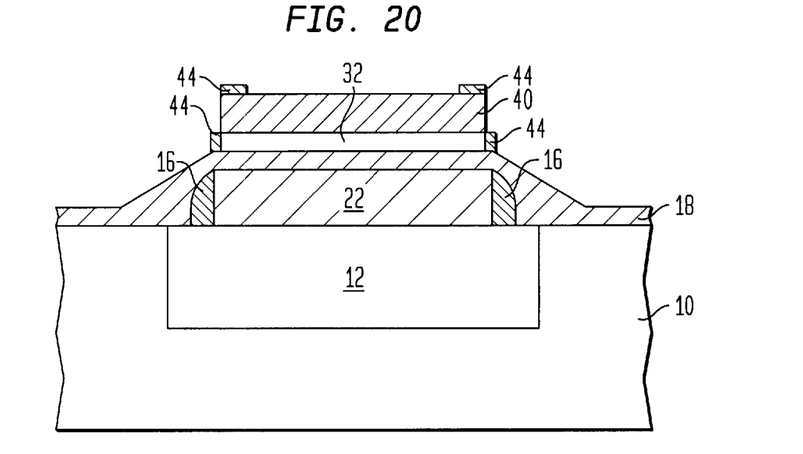
FIGS. 20–21 show an optional processing step wherein a patterned protective nitride layer is employed in the second embodiment of the present invention.
Figure 21:
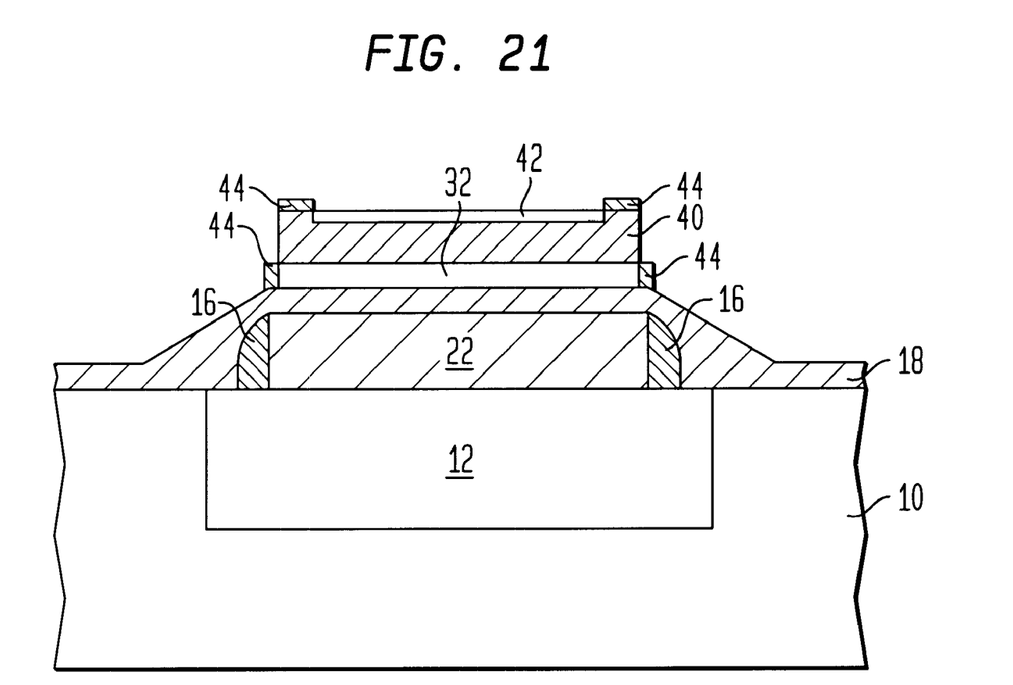

FIGS. 20–21 show an optional step of the second embodiment of the present invention wherein a patterned protective nitride layer is employed.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the letters patent is:

1. A method for fabricating a poly-poly capacitor integrated with a BiCMOS process comprising forming a lower plate electrode of a poly-poly capacitor during deposition of a gate electrode of a CMOS transistor, and forming an upper SiGe plate electrode of said poly-poly capacitor during growth of a SiGe base region of a heterojunction bipolar transistor.

2. The method of claim 1 wherein said lower plate electrode is formed by the steps of: forming a first polysilicon layer over a portion of an isolation region in a device region in which a poly-poly capacitor is to be formed; forming first nitride spacers about said first polysilicon layer; depositing a nitride layer over said first polysilicon layer and said first nitride spacers; and implanting ions of a first conductivity type into said first polysilicon layer so as to form said lower plate electrode of said poly-poly capacitor.

3. The method of claim 2 wherein said upper SiGe plate electrode is formed by the steps of: removing portions of said nitride layer so as to form second nitride spacers and to expose a portion of said lower plate electrode; forming a film stack on at least said exposed portion of said lower plate electrode, said film stack comprising an oxide layer, a second layer of polysilicon and a layer of SiGe; implanting ions of a second conductivity type that are different from said first conductivity type into said layer of SiGe and said second layer of polysilicon; etching at least said layer of SiGe and said second layer of polysilicon so as to form said upper plate electrode of said poly-poly capacitor; and saliciding all exposed surfaces of said upper SiGe plate electrode.

4. The method of claim 3 wherein a patterned protective nitride layer is formed on portions of said upper SiGe plate electrode prior to salicidation.

5. The method claim 2 wherein said upper SiGe plate electrode is formed by the steps of: forming a film stack on at least said nitride layer, said film stack comprising an oxide layer, a second layer of polysilicon and a layer of SiGe; implanting ions of a second conductivity type that are different from said first conductivity type into said layer of SiGe and said second layer of polysilicon; etching at least said layer of SiGe and said second layer of polysilicon so as to form said upper SiGe plate electrode of said poly-poly capacitor; and saliciding all exposed surfaces of said upper SiGe plate electrode.

6. The method of claim 5 wherein a patterned protective nitride layer is formed on portions of said upper SiGe plate electrode prior to salicidation.

7. A method for fabricating a poly-poly capacitor integrated with a BiCMOS process comprising the steps of:
(a) forming a first polysilicon layer over a portion of an isolation region in a device region in which a poly-poly capacitor is to be formed, and in a CMOS transistor device region, said first polysilicon layer in said CMOS transistor device region comprises a gate electrode of said CMOS transistor;
(b) forming fist nitride spacers about said first polysilicon layer in said poly-poly capacitor device region;
(c) depositing a nitride layer over said first polysilicon layer and said fist nitride spacers in said poly-poly capacitor device region;
(d) implanting ions of a first conductivity type into said first polysilicon layer so as to form a lower electrode of said poly-poly capacitor,
(e) removing portions of said nitride layer so as to film second nitride spacers and to expose a portion of said lower electrode;
(f) forming a film stack on at least said exposed portion of said lower electrode, said film stack comprising an oxide layer, a second layer of polysilicon and a layer of SiGe;
(g) implanting ions of a second conductivity type that are different from said fist conductivity type into said layer of SiGe and said second layer of polysilicon;
(h) etching at least said layer of SiGe and said second layer of polysilicon so as to form an upper electrode of said poly-poly capacitor, and
(i) saliciding all exposed surfaces of said upper electrode.

8. The method of claim 7 wherein a patterned protective nitride layer is formed on portions of the exposed upper electrode prior to saliciding.

9. The method of claim 7 wherein said first polysilicon layer is formed by a deposition process selected from the group consisting of chemical vapor deposition (CVD), plasma-assisted CVD, sputtering and chemical solution deposition.

10. The method of claim 7 wherein said first nitride spacers are formed by deposition and etching.

11. The method of claim 7 wherein said nitride layer is formed by a deposition process selected from CVD, plasma-assisted CVD, sputtering and chemical solution deposition.

12. The method of claim 7 wherein said layer of SiGe provided in step (f) is formed from a deposition process selected from the group consisting of ultra-high vacuum chemical vapor deposition (UHVCVD), molecular beam epitaxy (MBE), rapid thermal chemical vapor deposition (RTCVD) and plasma-enhanced chemical vapor deposition (PECVD).

13. A method for fabricating a poly-poly capacitor integrated with a BiCMOS process comprising the steps of:
(a) forming a first polysilicon layer over a portion of an isolation region in a device region in which a poly-poly capacitor is to be formed and in a CMOS transistor device region, said first polysilicon layer in said CMOS transistor device region comprises a gate electrode of said CMOS transistor;
(b) forming first nitride spacers about said first polysilicon layer in said poly-poly capacitor device region;
(c) depositing a nitride layer over said first polysilicon layer and said first nitride spacers layer in said poly-poly capacitor device region;
(d) implanting ions of a first conductivity type into said first polysilicon layer so as to form a lower electrode of said poly-poly capacitor;
(e) forming a film stack on at least said nitride layer, said film stack comprising an oxide layer, a second layer of polysilicon and a layer of SiGe;
(f) implanting ions of a second conductivity type that are different from said first conductivity type into said layer of SiGe and said second layer of polysilicon;
(g) etching at least said layer of SiGe and said second layer of polysilicon so as to form an upper electrode of said poly-poly capacitor; and
(h) saliciding all exposed surfaces of said upper electrode.

14. The method of claim 13 wherein a patterned protective nitride layer is formed on portions of the exposed upper electrode prior to saliciding.

15. The method claim 13 wherein said first polysilicon layer is formed by a deposition process selected from the group consisting of chemical vapor deposition (CVD), plasma-assisted CVD, sputtering and chemical solution deposition.

16. The method of claim 13 wherein said first nitride spacers are formed by deposition and etching.

17. The method of claim 13 wherein said nitride layer is formed by a deposition process selected from CVD, plasma-assisted CVD, sputtering and chemical solution deposition.

18. The method of claim 13 wherein said layer of SiGe provided in step (e) is formed from a deposition process selected from the group consisting of ultra-high vacuum chemical vapor deposition (UHVCVD), molecular beam epitaxy (MBE), rapid thermal chemical vapor deposition (RTCVD) and plasma-enhanced chemical vapor deposition (PECVD).

* * * * *